US008446710B2

(12) United States Patent
Schmitt et al.

(10) Patent No.: US 8,446,710 B2
(45) Date of Patent: May 21, 2013

(54) SYSTEM AND METHOD FOR STRUCTURAL, MODULAR POWER DISTRIBUTION IN A MODULAR DATA CENTER

(75) Inventors: Ty Schmitt, Round Rock, TX (US); Mark M. Bailey, Burnet, TX (US); Anthony Middleton, Round Rock, TX (US); Tyler Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 200 days.

(21) Appl. No.: 13/022,136

(22) Filed: Feb. 7, 2011

(65) Prior Publication Data
US 2012/0200987 A1    Aug. 9, 2012

(51) Int. Cl.
*H02H 9/02* (2006.01)
(52) U.S. Cl.
USPC ........... 361/624; 361/601; 361/115; 361/602; 361/641; 361/675; 174/68.1; 174/68.2; 174/480; 174/481; 174/482
(58) Field of Classification Search
USPC ................ 361/600–605, 611, 622–627, 637, 361/647–650, 679.02, 679.33–679.63, 690, 361/688, 689, 698, 699, 93.1, 115; 174/50, 174/60, 48, 68.3, 59, 17 R, 68.1, 100, 135, 174/72 A, 65 R, 99 R, 112; 312/223.2, 236, 312/265.1, 265.3, 265.4, 257.1, 265.5; 307/42, 307/46, 64–66, 103, 125, 141, 147; 52/79.1, 52/143, 302.1, 173.1, 220.1, 220.3, 220.5, 52/263; 29/592, 592.1; 363/52, 69
See application file for complete search history.

(56) References Cited

U.S. PATENT DOCUMENTS

| | | | | |
|---|---|---|---|---|
| 5,053,637 A * | 10/1991 | Dillard | ......................... | 307/147 |
| 6,617,708 B2 * | 9/2003 | Boost | ............................. | 307/42 |
| 6,967,283 B2 * | 11/2005 | Rasmussen et al. | ............ | 174/50 |
| 7,278,273 B1 * | 10/2007 | Whitted et al. | ............... | 62/259.2 |
| 7,492,057 B2 * | 2/2009 | Baldwin et al. | ................. | 307/64 |
| 7,511,960 B2 * | 3/2009 | Hillis et al. | ................... | 361/702 |
| 7,619,868 B2 * | 11/2009 | Spitaels et al. | ................ | 361/115 |
| 7,646,590 B1 * | 1/2010 | Corhodzic et al. | ............ | 361/641 |
| 7,724,513 B2 * | 5/2010 | Coglitore et al. | ........ | 361/679.47 |
| 7,724,518 B1 * | 5/2010 | Carlson et al. | ........... | 361/679.53 |
| 7,738,251 B2 * | 6/2010 | Clidaras et al. | ............... | 361/701 |
| 7,971,446 B2 * | 7/2011 | Clidaras et al. | ............. | 62/259.2 |
| 7,990,710 B2 * | 8/2011 | Hellriegel et al. | ............ | 361/699 |
| 8,004,831 B1 * | 8/2011 | Carlson et al. | ........... | 361/679.53 |
| 8,218,322 B2 * | 7/2012 | Clidaras et al. | ............... | 361/701 |
| 8,238,082 B2 * | 8/2012 | Salpeter | ................... | 361/679.02 |
| 8,264,840 B2 * | 9/2012 | Bergthold et al. | ............ | 361/690 |
| 8,300,410 B2 | 10/2012 | Slessman | | |
| 2006/0082263 A1 * | 4/2006 | Rimler et al. | .................. | 312/201 |
| 2007/0025271 A1 * | 2/2007 | Niedrich et al. | ............... | 370/254 |
| 2009/0031148 A1 * | 1/2009 | Densham | ...................... | 713/300 |
| 2010/0302744 A1 * | 12/2010 | Englert et al. | ................ | 361/730 |
| 2012/0140415 A1 * | 6/2012 | Driggers | ...................... | 361/692 |

* cited by examiner

*Primary Examiner* — Michail V Datskovskiy
(74) *Attorney, Agent, or Firm* — Baker Botts L.L.P.

(57) ABSTRACT

In accordance with the present disclosure, a system and method for structural power distribution in a modular data center. In particular, the present application describes a modular data center with a modular structural frame. The modular structural frame defines an enclosure, and a plurality of information handling systems may be located in the enclosure. The modular data center may also include a power distribution pathway that is at least partially disposed within the modular structural frame of the modular data center. The modular data center may also include a plurality of power distribution elements disposed within the power distribution pathway, which power the information handling systems located in the enclosure.

19 Claims, 7 Drawing Sheets

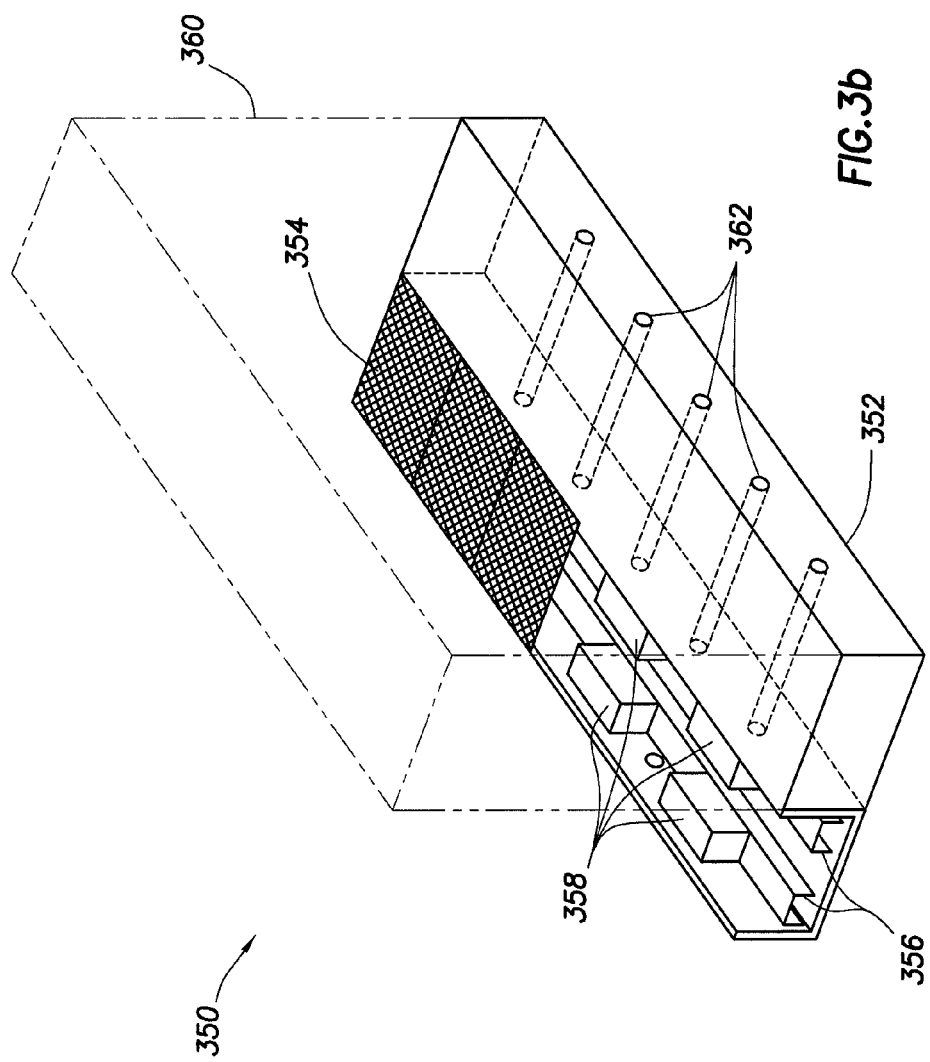

SYSTEM AND METHOD FOR STRUCTURAL, MODULAR POWER DISTRIBUTION IN A MODULAR DATA CENTER

CROSS REFERENCES TO RELATED APPLICATIONS

This application is related to co-pending U.S. patent application Ser. No. 13/022,018 entitled "System and Method for Designing a Configurable Modular Data Center" which was filed on Feb. 7, 2011, U.S. patent application Ser. No. 13/021,971 entitled "System and Method for Concurrent Manufacturing, Testing, and Integration of a Modular Data Center" which was filed on Feb. 7, 2011, U.S. patent application Ser. No. 13/033,451 entitled "System and Method for a Modular Fluid Handling System with Modes in a Modular Data Center" which was filed on Feb. 23, 2011, and U.S. patent application Ser. No. 13/022,211 entitled "System and Method for an Optimizable Rack Solution", which was also filed on Feb. 7, 2011, all of which are incorporated herein by reference for all purposes.

TECHNICAL FIELD

The present disclosure relates generally to the operation of computer systems and information handling systems, and, more particularly, to a System and Method for Structural Power Distribution in a Modular Data Center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A group of information handling systems may be included within a data center. In a modular data center, multiple information handling systems arranged in racks are included in a modular container. One example of a modular data center is a containerized data center, which is constructed in a shipping container sized according to standards defined by the International Organization for Standardization ("ISO"). A containerized data center, however, provides limited space within which to locate information handling systems and other equipment. One difficulty with containerized data centers is efficiently utilizing the limited space in the enclosure. For example, each information handling system requires power to operate. The necessary power is typically provided using a variety of power equipment, most of which is installed within the shipping container. Unfortunately, this equipment take up valuable space that could otherwise be used for additional information handling systems.

Additionally, containerized data centers can have a wide range of power needs, depending on the types of information handling systems installed and the other electrical equipment within the data center. Power distribution systems are typically designed for the power needs of a particular data center, and are not generally interchangeable or easily modifiable. For example, a typical containerized data center uses a plurality of copper cables, each of which is sized and rated specific to the placement and power requirements of the electrical equipment in the data center. One difficulty with modular data centers is easily and efficiently modifying the power distribution system in response to changes in the placement and power requirements of the electrical equipment within the data center.

SUMMARY

In accordance with the present disclosure, a system and method for structural power distribution in a modular data center. In particular, the present application describes a modular data center with a modular structural frame. The modular structural frame defines an enclosure, and a plurality of information handling systems may be located in the enclosure. The modular data center may also include a power distribution pathway that is at least partially disposed within the modular structural frame of the modular data center. The modular data center may also include a plurality of power distribution elements disposed within the power distribution pathway, which power the information handling systems located in the enclosure.

The system and method disclosed herein is technically advantageous because it locates the power distribution elements in a location that does not decrease the space available for information handling systems. Additionally, locating the power distribution elements in a separate channel allows for unique and efficient cooling methods that are otherwise not available. Also, according to one embodiment of the present invention, a modular data center with structural power distribution may include scalable power distribution elements, which allow a modular approach to the design and implementation of the power distribution system and modular data center in general. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3b is an isometric view of a modular data center according to one embodiment of the present invention.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
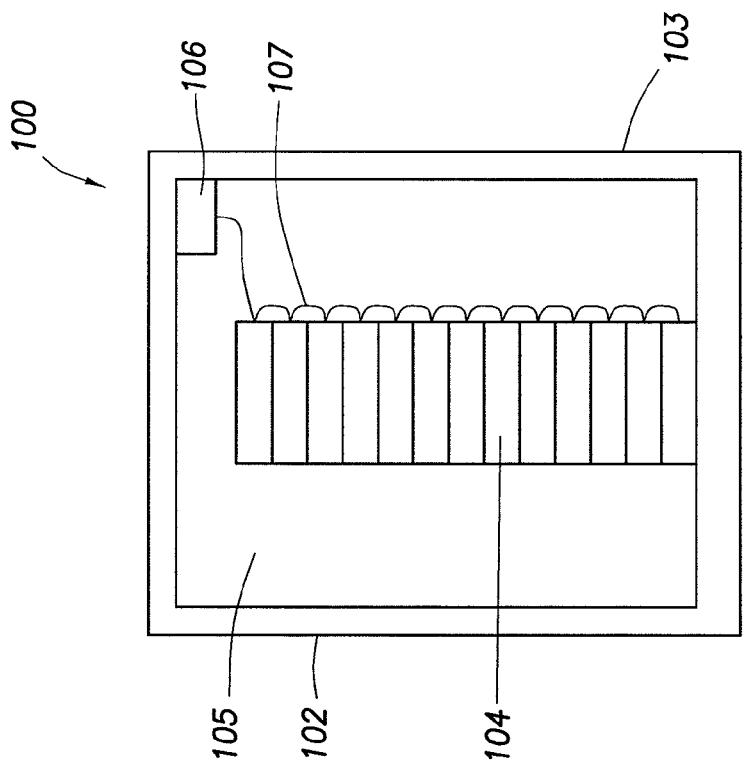
FIG. 1 is a cross-section of a prior art modular data center.

A plurality of information handling systems may be placed within a modular data center. Modular data centers are typically constructed in modular containers, such as shipping containers. FIG. 1 shows a cross section of a typical modular data center 100. Data center 100 includes a container structure with a structural frame that includes a top 101, sides 102, and a base 103. The data center 100 also includes an enclosure that is defined by the interior surfaces of the structural frame. Equipment—including racks 104 as well as power equipment 107 and cables 107—are typically installed within the interior space of data center 100. Additionally, data center 100 normally includes an aisle 105 to allow users and technicians to access the information handling systems and other equipment within the interior of the data center. As can be seen from FIG. 1, space is limited in the data center 100. Adding additional equipment, such a power cables, etc., within a data center like the one shown in FIG. 1 is difficult and many times requires that the number of racks or information handling systems be reduced.

Figure 2A:
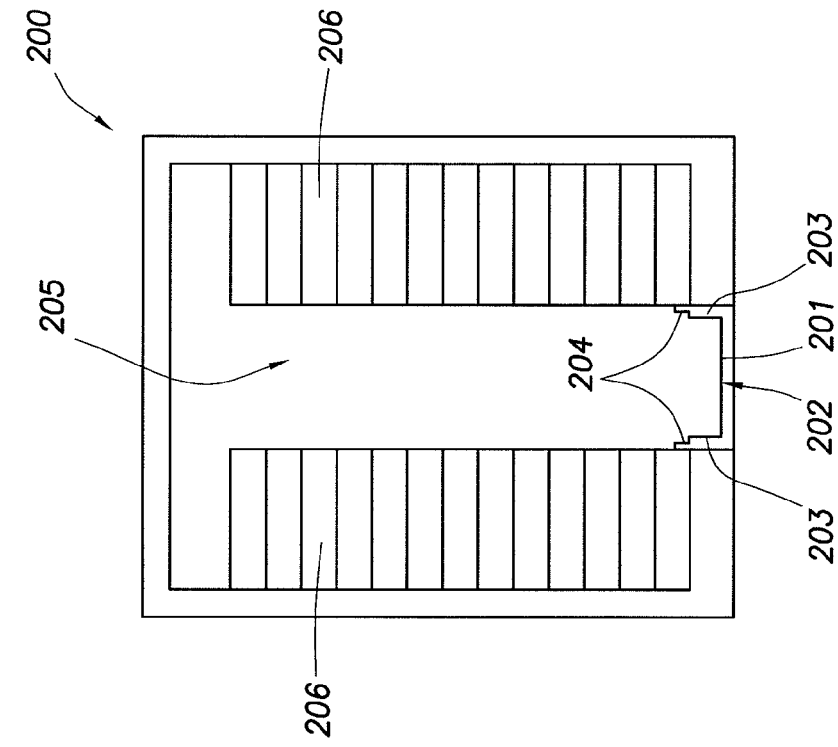
FIG. 2a is a cross section of a modular data center according to one aspect of the present invention.

Accordingly, one aspect of the present invention is directed to a power distribution pathway proximate the floor of a modular data center. In some embodiment, the power distribution pathway proximate the floor may be a channel disposed within the structural frame of a modular data center. By disposing a channel within the structural frame of the modular data center, the amount of usable space is increased. Equipment, such as power distribution elements, can be installed within the channel, alleviating the space limitations imposed by a standard modular data center. FIG. 2a shows cross section of a modular data center 200, according to an embodiment of this aspect of the invention. In particular, FIG. 2a shows a power distribution pathway, channel 201, partially disposed within the structural base 202 of the modular data center 200. The channel 201 may be integrally manufactured with the structure of modular data center 200, or it may comprise an independently manufactured frame, as shown, that is installed within the structure of the modular data center 200. The channel 201 of FIG. 2a includes a structure with a base and two sides extending vertically from the sides of the base. The channel 201 is partially disposed within the base 202 of the modular data center 200, such that the sides of the channel 201 extends beyond the plane of the base 202 into the enclosure of modular data center 200. Other configurations are possible, such as the channel 201 being totally disposed within the base 202 of the modular data center 200, with no portion of the channel 201 extending into the enclosure. Likewise, the channel 201 can be placed in other structural pieces of modular data center 200, like the sides or top.

Figure 3A:
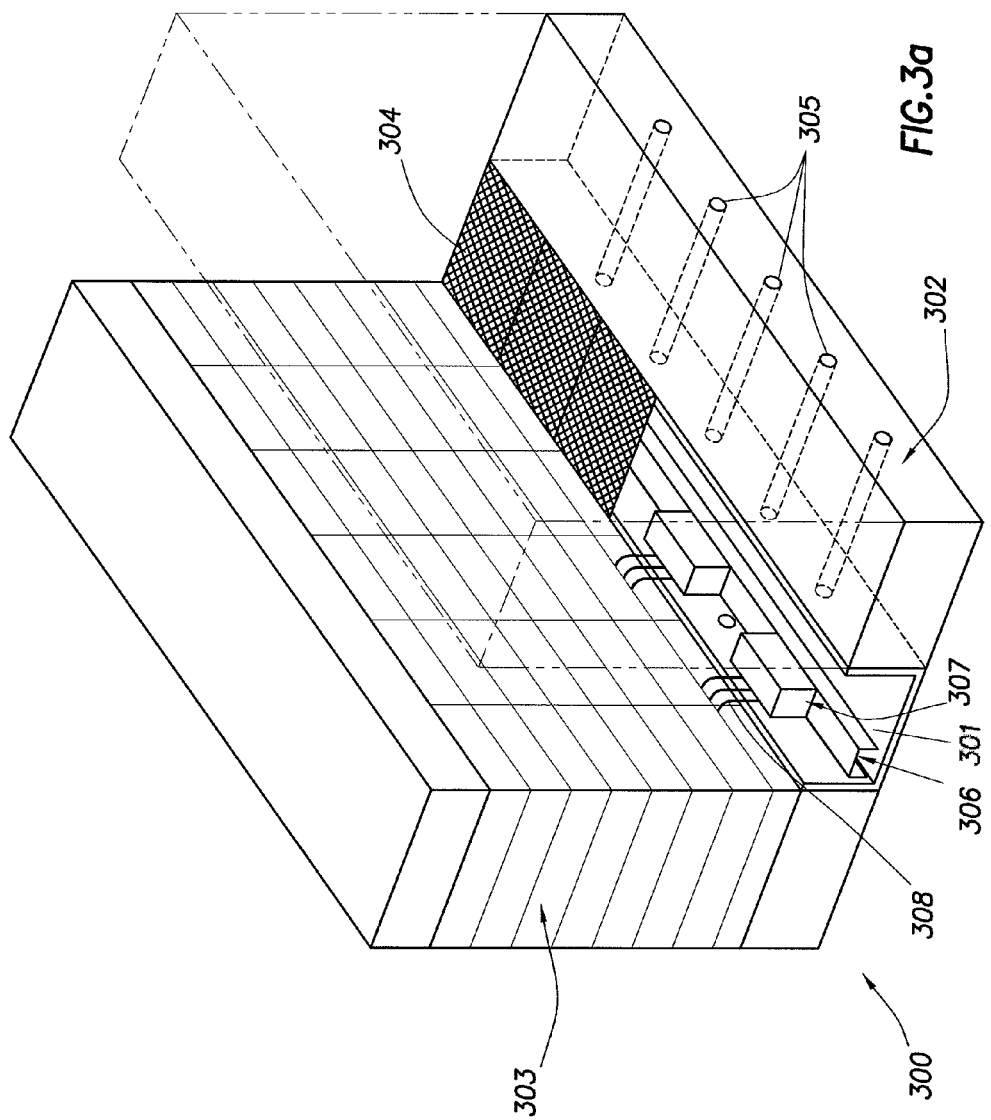
FIG. 3a is an isometric view of a modular data center according to one embodiment of the present invention.

The channel 201 has a depth that is substantially the same as the thickness of the base 202, except for the thickness of the structure of channel 201. Other embodiments may include channels with various depths, but a channel with the depth shown in FIG. 2a is preferred because it maximizes the additional space within a modular data center. Additionally, a channel with the depth shown in FIG. 2a may be deep enough so that power distribution equipment, such as breaker boxes 307 (shown in FIG. 3), can be installed within the channel 201 without extending into the enclosure of the modular data center 200. This is advantageous because it allows the channel 201 to be covered, for example with removable grates 304 (as shown in FIGS. 3a and 3b), preserving the usable interior surfaces of the structural frame. The power distribution pathway 201 can be covered with any methods and materials well known in the art. The embodiment shown in FIG. 2a includes notches 204 disposed on the interior faces of sides of the channel 201. Covers, such as the removable grates 304 shown in FIG. 3, can then be installed in the channel 201 and held in place by gravity.

Figure 2B:
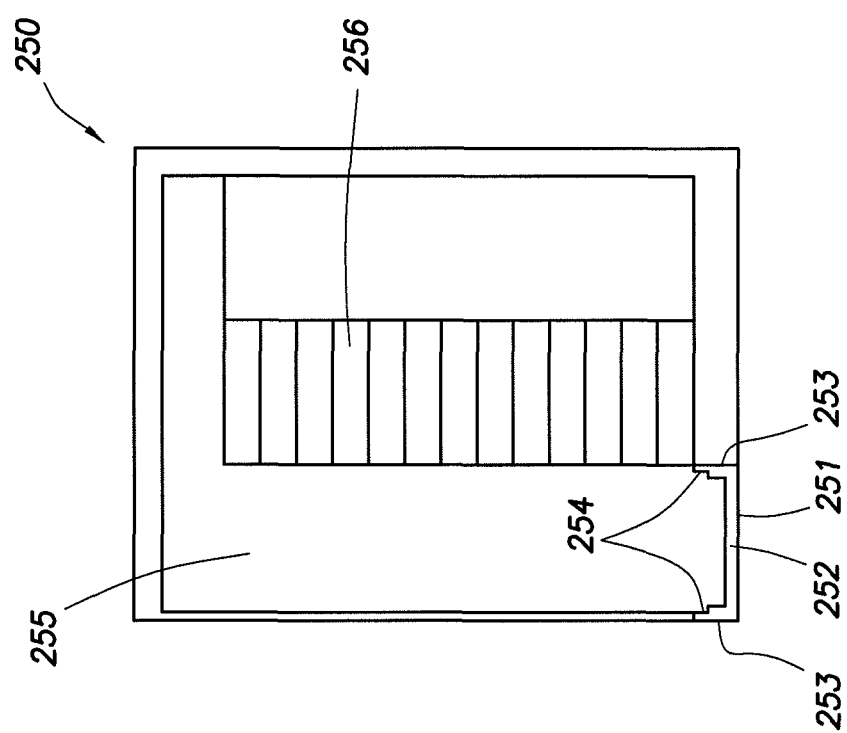
FIG. 2b is a cross section of a modular data center according to one aspect of the present invention.

In other embodiments, such as the embodiment shown in FIG. 2b, the power distribution pathway 251 may be proximate the base 252 at a location other than the center of the base 252. FIG. 2b in particular shows a single row of racks 256 and an aisle 255 to one side of the racks 256. Preferably, power distribution pathway 251 will be located beneath aisle 255. Locating the power distribution pathway 251 beneath an aisle is preferred, because doing so increases the accessibility of equipment installed within the power distribution pathway 251. For example, if the power distribution pathway 251 were partially covered by a rack, accessing the equipment would require that a rack, possibly full of information handling systems, would have to be moved.

FIG. 3a is a diagonal view of a modular data center 300. The modular data center 300 may be an IT module from a modular data center, as described in the cross referenced application entitled, "System and Method for a Designing a Configurable Modular Data Center." The sides and top of the structural frame of the modular data center 300 are made transparent to allow a better view of the enclosure defined by the structural frame of the modular data center 300. Additionally, one row of racks are removed to better illustrate the channel 301. The modular data center 300 includes a structural base 302. Mounted on an interior surface of the structural base 302 are racks 303. Disposed within the structural base 302 is a power distribution pathway 301. The power distribution pathway 301 comprises a structure which includes a base and sides, with the sides of the power distribution pathway 301 flush with the interior surface of the structural base 302 of the modular data center 300. As can be seen, power distribution pathway 301 extends along the entire length of modular data center 300. A power distribution pathway which extends the entire length of a modular data center is preferable, as it maximizes the amount of additional space provided by the channel 301, but there may be embodiments where a channel is shorter than the entire length of a modular data center. For example, some embodiments may include structural frame pieces (not shown) that cover the ends of the power distribution pathway for the purpose to increasing the structural integrity of the modular data center.

A plurality of removable grates 304 are shown covering part of power distribution pathway 301. When in operation, the modular data center 300 may include removable grates 304 over the entire length of the power distribution pathway 301. As mentioned previously, the preferred location for a power distribution pathway is beneath an aisle within a modular data center. With the power distribution pathway 301 covered with removable grates 304, a technician would be able to use the aisle as intended—accessing the information handling systems within the racks 303. The term removable grate is not intended to be limiting, however, and a removable grate can be any suitable cover. When located in a footpath of a data center, the covers should supports a sufficient amount of weight for foot traffic. Additionally, in a preferred embodiment, the cover should provide fluid communication between the power distribution pathway and the enclosure, as part of a novel air flow approach that incorporates the channel.

The modular data center 300 also includes venting shafts 305. The venting shafts 305 may provide an independent cooling avenue for the power distribution pathway 301 and the equipment installed within the power distribution pathway 301. Typically, equipment within a modular data centers is cooled by air circulated within the interior of the modular data center. Locating equipment within a power distribution pathway disposed in the structure of a modular data center generally removes the equipment from the path of the circulating air. Accordingly, the equipment within the power distribution pathway may have a tendency to over heat. Including an independent avenue for air flow insures that air will circulate past the equipment within the power distribution pathway, thereby cooling the equipment.

In one embodiment, as shown in FIG. 3a, a plurality of venting shafts 305 extend from the outer surface of the base 301 of the modular data center 300 to the power distribution pathway 301. The air intake may come from the end of the venting shafts 305 disposed on the outside of the structural base 302. The air may then be circulated through the venting shaft 305 and out of the end of the venting shaft 305 disposed in the power distribution pathway 305. The air can then flow past any equipment installed within the power distribution pathway 301 and finally into the enclosure of the modular data center 300, through the removable grates 304. The venting shafts 305 of the modular data center 300 may be included at a regular interval on both sides of the power distribution pathway 301, as shown, but a variety of arrangements are possible. For example, the venting shafts may be included at a non-regular interval, the venting shafts may be included on only one side of the power distribution pathway 301, or the venting shafts may have shorter or longer lengths depending on the location of the channel 301. Each of the venting shafts 301 may also include adjustable orifices. The adjustable orifices can be adjusted to a variety of sizes ranging from closed to fully open. For example, if the power distribution pathway 301 is full of power distribution equipment, the adjustable orifices may be fully opened to allow maximum airflow through the venting shafts 305. In contrast, if power distribution pathway 301 is only partially full of power distribution equipment, some of the venting shafts can be blocked.

Another embodiment of a modular data center incorporating aspects of the present invention is the modular data center 350 found in FIG. 3b. Unlike the modular data center of FIG. 3a, modular data center 350 include a single row of racks 306 and a power distribution pathway offset across the base of the modular data center 350. The power distribution pathway also includes multiple power distribution paths, busways 356, along which power may travel into the modular data center. In FIG. 3b, the venting shafts 362 only extend out one side of the modular data center 350.

Figure 4:
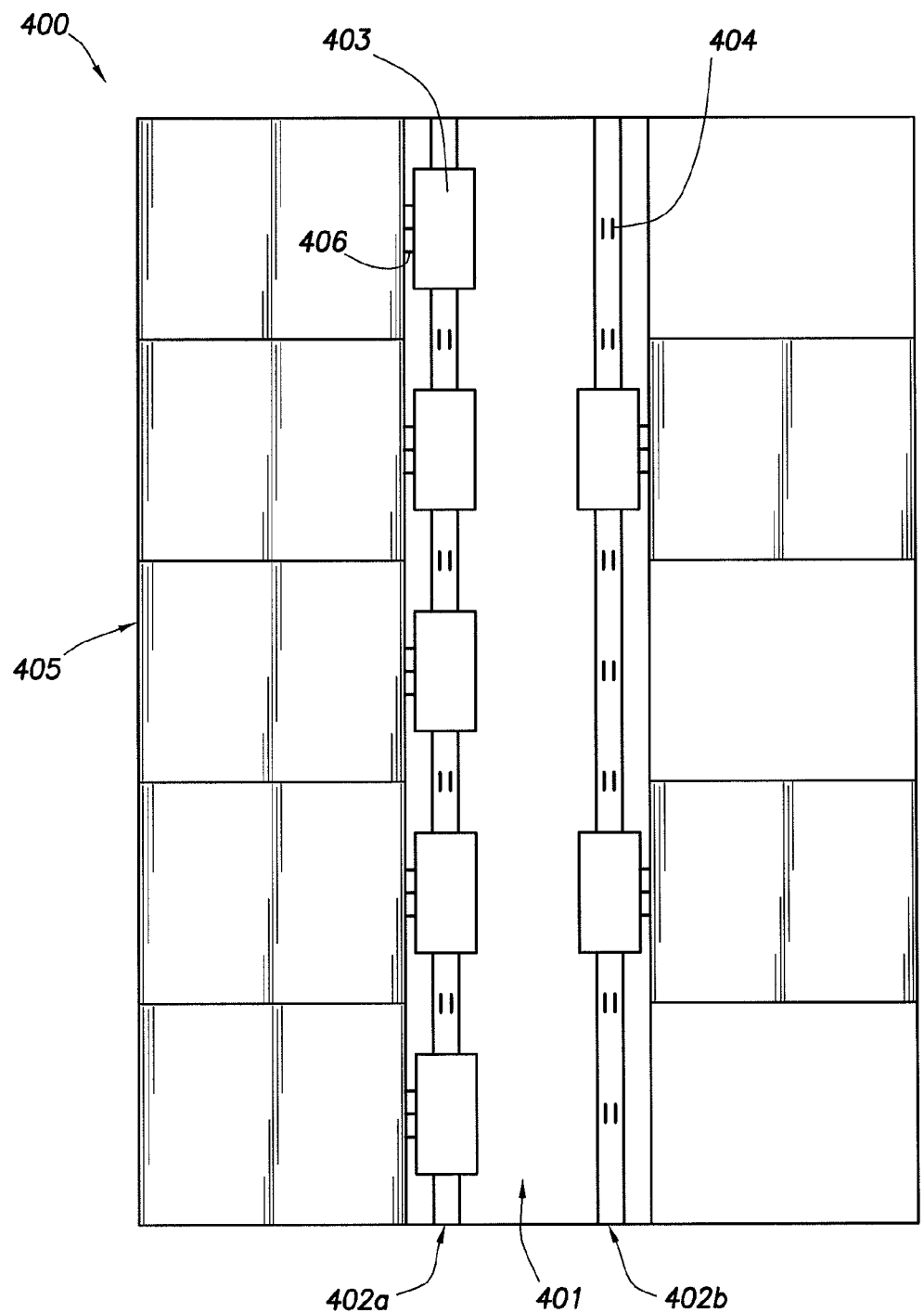
FIG. 4 is a top-view of a cross section of a modular data center according to a preferred embodiment of the present invention.

Numerous power distribution elements can be installed within power distribution pathway 301. In the embodiment shown in FIG. 3a the power distribution elements include a bus way 306, breaker boxes 307, and (partially installed within the channel 301) connectors 308. Other embodiments may include multiple busways, wiring, or other power distribution paths well known in the art. The bus way 306, breaker boxes 307, and connector 308 are preferable, however, because they are scalable power distribution elements—designed for or to allow interchangeability and efficient modification of a power distribution system. Other examples of scalable power distribution elements may include bus bars. The bus way 306 may be connected to a power source outside of the modular data center 300. When powered, the bus way 306 provides power to a plurality of connection points 404 through which other scalable power distribution elements can be attached, as can be seen in FIG. 4. Breaker boxes 307 are attached to the bus way 306 and are powered through the connection points located on the bus way 306. If the location of one of the racks 303 needs to be changed, the corresponding breaker box 307 can be unconnected from the bus way 306, moved to a different place along the bus way 306, connected to a new connection point, and connected to the information handling systems of the rack 303. Likewise, if the power requirements of the information handling systems within a rack change, the breakers in the breaker box 307 associated with the rack can be swapped out, or the breaker box 307 itself can be swapped out to accommodate the new power requirements. Furthermore, some information handling systems require different power connectors. As such, the connectors 308 are designed to be swapped out easily.

Typical data centers include power distribution elements that include external breaker boxes and a plurality of copper cables that are sized according to the placement and power requirements of the information handling systems within the data center. These power distribution elements, however, are generally not scalable. The copper cables, for example, generally must be re-sized and re-installed when the power requirements or location of the information handling systems of the data center are changed, or, alternatively, the cables must be left very long to accommodate movement of information handling systems within the data center, which takes up space. Neither alternative is tailored for interchangeability and easy modification. In some embodiments of the present invention, copper cables may be installed within the channel to provide power within a modular data center. This embodiment, however, is not ideal because it is not efficient and does not allow the modular data center to be easily modified.

FIG. 4 is a top-view of a cross section of a modular data center 400, according to one embodiment of the present invention, which illustrates the placement and benefits of scalable power distribution elements installed within a power distribution pathway 401 disposed in the modular data center 400. Installed within the power distribution pathway 401 of the modular data center 400 are two bus ways 402a and 402b. Although two busways are shown, more busways or power distribution pathways can be added within the power distribution pathway. Each of the bus ways 402a and 402b include a plurality of breaker boxes 403 connected to connection points 404. The left side of the modular data center 400 includes racks 405, each populated with information handling systems. Each of the racks 405 is shown attached to an associated breaker box 403. Each of the associated breaker boxes 403 provide power to the respective information handling system through connectors 406 If, for example, the racks 405 were shifted, the breaker boxes 403 could be easily moved to different connection points along the bus way 402a. Additionally, if one of the racks were to be removed, the breaker box 403 could be easily removed. Likewise, if the information handling systems were changed to a different brand, which required different connectors, the connectors 408 could be easily swapped out. Bus way 402b shows how the breaker boxes 403 could be positioned with a slightly different rack arrangement. In particular, because there are only two racks 403 on the right side of the modular data center, only two breaker boxes 403 are necessary. Additionally, the inclusion of the second bus way 402b itself is beneficial. In a typical modular data center, such as a containerized data center, a separate row of racks would require an entirely new group of copper cables to be cut and wired. In FIG. 4, adding another row of racks requires installation of a single bus way 402b and connecting the breaker boxes 403 in the appropriate locations.

Figure 5:
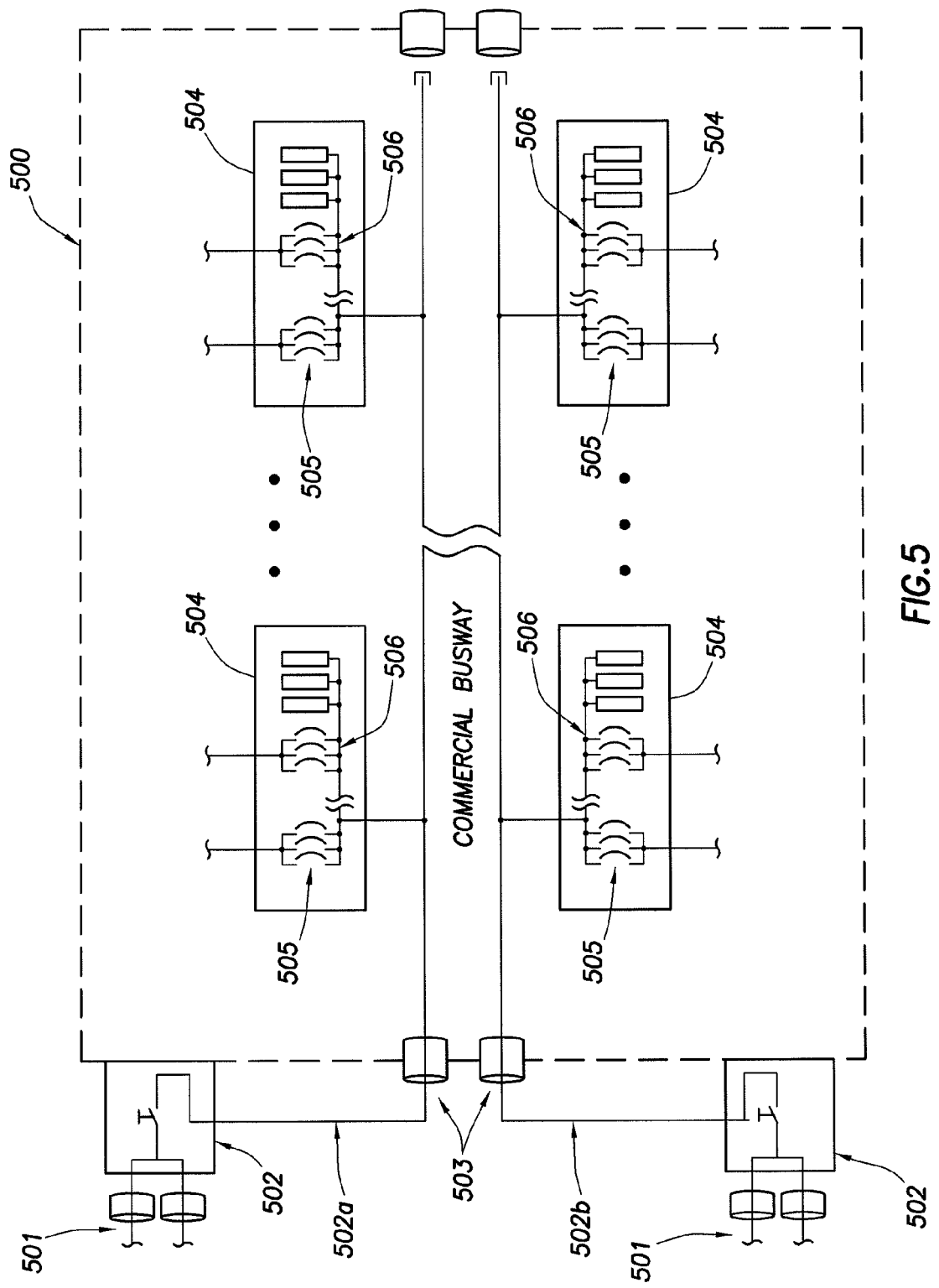
FIG. 5 is a wiring diagram of a modular data center according to one aspect of the present invention.

FIG. 5 illustrates a wiring diagram for a modular data center incorporating scalable power distribution elements in a modular data center according to a preferred embodiment of the present invention. The modular data center 500 is shown as a dashed line. On the outside of the modular data center 500 are power source connections 501. The power source connection 501 are installed into fused disconnect boxes 502, which includes throw-switches to cut off power to the modular data center 500. The fused disconnect boxes 502 feed power to the bus ways 502a and 502b, which may enter into the structural base of the modular data center 500 through water-proof penetration points 503. The bus ways 502a and 502b the travel the length of the modular data center 500. Connected along the bus ways, through connection points are a plurality of breaker boxes 504. Each of the break boxes 504 include a plurality of fuses 505, and a plurality of connectors 506, which provide power to information handling systems within the modular data center 500. The bus ways may end in a water tight end cap at the end of the modular data center 500 opposite the side they entered, or may proceed through water-proof penetration points.

Figure 6:
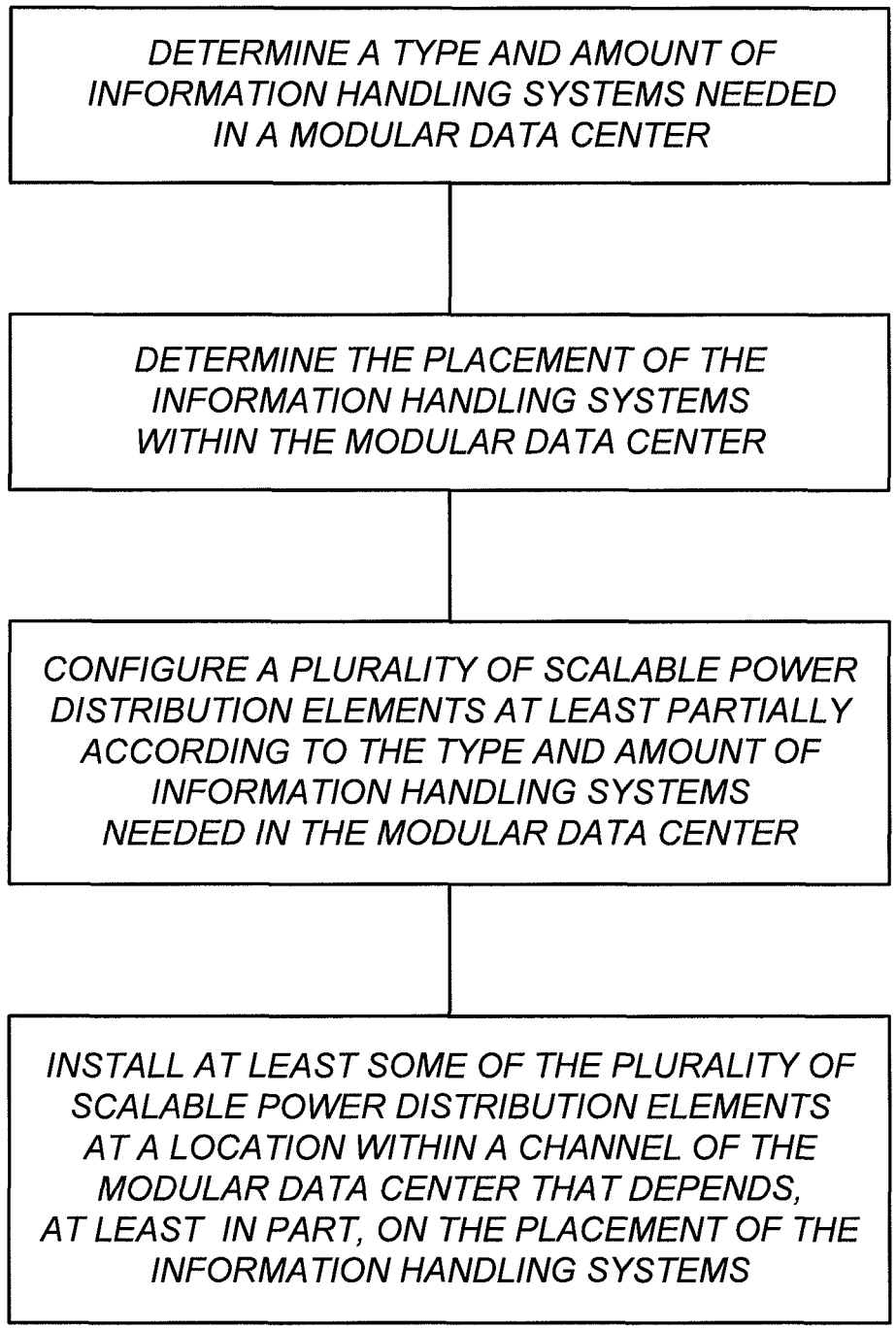
FIG. 6 is a flow diagram of a method for designing a modular power distribution system according to one aspect of the present invention.

FIG. 6 is a flow diagram for a method of designing a modular power distribution system for a modular data center, according to one aspect of the present invention. One step of the method includes determining a type and amount of information handling systems needed in a modular data center. Determining a type and amount of information handling systems may include deterring a brand and overall capacity of computing systems needed in a data center. In some embodiments, determining a type and amount of information handling systems may include determining a number of racks and the amount of computing systems to be mounted in each rack.

Determining a type and amount of information handling systems may also include determining a power requirement for each information handling system or a power requirement for each rack inside of the information handling system.

The method may also include determining the placement of the information handling systems within the modular data center. Determining the placement of the information handling systems may include determining where each rack populated with information handling systems will be located along the length of a modular data center, as is shown in FIG. 4. This step may be important to the overall design of a modular data center as well as the design of the power distribution elements within the modular data center.

The method shown in FIG. 6 may also include configuring a plurality of scalable power distribution elements at least partially according to the type and amount of information handling systems needed in a the modular data center. As shown in FIGS. 3-5, a modular data center may include a plurality of power distribution elements, particularly scalable distribution elements, such as busways, breaker boxes, and connectors. As described regarding FIG. 4, the scalable elements can be configured according to, for example, the power requirements and information handling systems in the modular data center. For example, as shown in FIG. 4, a breaker box may be dedicated for each rack populated with information handling systems. Each of the breaker boxes may be configured according to the particular rack and information handling systems to which it corresponds, including altering breakers and fuses within the breaker box to provide a certain power output and cutoff point.

The method shown in FIG. 6 may finally include the step of installing at least some of the plurality of scalable power distribution elements at a location within a power distribution pathway, or channel, of the modular data center that depends, at least in part, on the placement of the information handling systems. As described above, for example, in FIG. 3, power distribution elements, including scalable power distribution elements may be installed or disposed within a power distribution pathway that is at least partially disposed within the structural frame of a modular data center. This may include a busway that is installed within the power distribution pathway. As shown in FIG. 4, depending on the location of the information handling systems within the modular data center, e.g. the location of each rack within the modular data center, breaker boxes can be inserted into connection points on the bus bar, that are located along the length of the modular data center.

The modular data center described herein will tend to increase the efficiency and flexibility of a modular data center. Power distribution can be tailored to a specific arrangement of operational elements within the system and can be easily modified. Additionally, by locating the power distribution equipment with the structure of the modular data center, additional information handling systems can be located within the data center, increasing the computing power and value of a modular data center. Although the present disclosure has been described in detail, it should be understood that various changes, substitutions, and alterations can be made hereto without departing from the spirit and the scope of the invention as defined by the appended claims.

What is claimed is:

1. A modular data center, comprising:
   a modular structural frame, wherein the modular structural frame define an enclosure;
   a plurality of information handling systems located within the enclosure;
   a power distribution pathway at least partially disposed within the modular structural frame; and
   a plurality of power distribution elements installed within the power distribution pathway, wherein the plurality of power distribution elements power at least the information handling systems.

2. The modular data center of claim 1, wherein at least some of the plurality of power distribution elements are scalable power distribution elements.

3. The modular data center of claim 2, wherein at least one of the scalable power distribution elements is a bus way.

4. The modular data center of claim 2, wherein at least one of the scalable power distribution elements is a breaker box associated with one of the racks.

5. The modular data center of claim 3, wherein at least one other scalable power distribution element is a breaker box connected to the bus way through one of a plurality of connection points located on the bus way.

6. The modular data center of claim 1, wherein the modular structural frame includes a structural base and the power distribution pathway is at least partially disposed within the structural base.

7. The modular data center of claim 1, wherein the power distribution pathway is located underneath an aisle in the enclosure of the modular structural frame.

8. The modular data center of claim 1, wherein the modular structural frame includes venting shafts that extend from the power distribution pathway to the outside of the modular structural frame.

9. The modular data center of claim of claim 7, wherein the modular structural frame includes a structural base and the venting shafts are disposed in the structural base.

10. A method for designing a modular power distribution system for a modular data center, comprising:
   determining a type and amount of information handling systems needed in a modular data center;
   determining the placement of the information handling systems within the modular data center;
   configuring a plurality of scalable power distribution elements at least partially according to the type and amount of information handling systems needed in the modular data center; and
   determining the placement of at least some of the plurality of scalable power distribution elements at a location within a power distribution pathway of the modular data center that depends, at least in part, on the placement of the information handling systems.

11. The method of claim 10, wherein the power distribution pathway is at least partially disposed in a structural base of the modular data center.

12. The method of claim 10, wherein configuring a plurality of scalable power distribution elements includes configuring a breaker box that corresponds to a rack populated with some of the determined amount of information handling systems.

13. The method of claim 10, wherein determining the placement of at least some of the plurality of scalable power distribution elements at a location within the power distribution pathway includes connecting a breaker box to a bus way disposed within the power distribution pathway.

14. The method of claim 11, wherein determining a type and amount of information handling systems may include determining a number of racks and the amount of computing systems to be mounted in each rack.

15. The method of claim 10, wherein determining a type and amount of information handling systems includes determining a power requirement for each information handling system.

16. The method of claim 10, wherein the step of determining the placement of at least some of the scalable power distribution elements comprises moving a breaker box to a different location within the channel.

17. A modular data center, comprising:
   a modular structural frame, including a structural base;
   a channel at least partially disposed within the structural base;
   at least one bus way installed within channel, wherein the at least one bus way is powered using a power source outside of the modular structural frame, wherein the at least one bus way includes a plurality of connection points, and wherein a plurality of breaker boxes are installed within the channel and attached to the bus way.

18. The modular data center of claim 17, wherein the plurality of breaker boxes are operable to be moved to different locations within the channel along the bus way.

19. The modular data center of claim 17, wherein each of the plurality of breaker boxes provide power to different racks populated with information handling systems within the modular data center.

* * * * *